(12) United States Patent
Yoshimura

(10) Patent No.: US 7,141,872 B2
(45) Date of Patent: Nov. 28, 2006

(54) SEMICONDUCTOR DEVICE AND METHOD OF MANUFACTURING SEMICONDUCTOR DEVICE

(75) Inventor: Atsushi Yoshimura, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/807,311

(22) Filed: Mar. 24, 2004

(65) Prior Publication Data

US 2004/0238935 A1    Dec. 2, 2004

Related U.S. Application Data

(63) Continuation of application No. PCT/JP02/09826, filed on Sep. 25, 2002.

(30) Foreign Application Priority Data

Sep. 28, 2001 (JP) .............................. 2001-304745

(51) Int. Cl.
*H01L 23/02* (2006.01)
(52) U.S. Cl. ...................... 257/686; 257/774; 257/797; 257/E25.013; 257/E23.067
(58) Field of Classification Search ................ 257/685, 257/686, 774, 777, 783, 797; 438/109, 118, 438/401, 975
See application file for complete search history.

(56) References Cited

U.S. PATENT DOCUMENTS

| | | | |
|---|---|---|---|
| 5,239,448 A | 8/1993 | Perkins et al. | |
| 6,020,629 A * | 2/2000 | Farnworth et al. | 257/686 |
| 6,469,374 B1 | 10/2002 | Imoto | |
| 6,472,735 B1 * | 10/2002 | Isaak | 257/686 |
| 6,492,718 B1 * | 12/2002 | Ohmori | 257/686 |
| 6,577,013 B1 * | 6/2003 | Glenn et al. | 257/777 |
| 6,617,695 B1 * | 9/2003 | Kasatani | 257/778 |
| 6,774,478 B1 * | 8/2004 | Eto et al. | 257/686 |
| 2002/0036338 A1 * | 3/2002 | Matsuo et al. | 257/686 |

FOREIGN PATENT DOCUMENTS

| | | |
|---|---|---|
| JP | 7-106509 | 4/1995 |
| JP | 2001-68624 | 3/2001 |
| JP | 2001-230365 | 8/2001 |

\* cited by examiner

*Primary Examiner*—Kenneth Parker
*Assistant Examiner*—José R. Diaz
(74) *Attorney, Agent, or Firm*—Finnegan, Henderson, Farabow, Garrett & Dunner, L.L.P.

(57) ABSTRACT

Disclosed is a method of manufacturing a semiconductor device, comprising preparing a first substrate including an integrated circuit chip, first connection terminals electrically connected to terminals of the integrated circuit chip, and a first connection portion spaced from the first connection terminals, preparing a second substrate including second connection terminals to be electrically connected to the first connection terminals and a second connection portion spaced from the second connection terminals, providing a metal material portion for bonding on the first connection portion or the second connection portion, and stacking the first substrate and the second substrate by connecting the first connection portion and the second connection portion together via the metal material portion by thermo compression bonding.

8 Claims, 7 Drawing Sheets

SEMICONDUCTOR DEVICE AND METHOD OF MANUFACTURING SEMICONDUCTOR DEVICE

CROSS-REFERENCE TO RELATED APPLICATIONS

This is a Continuation Application of PCT Application No. PCT/JP02/09826, filed Sep. 25, 2002, which was not published under PCT Article 21(2) in English.

This application is based upon and claims the benefit of priority from prior Japanese Patent Application No. 2001-304745, filed Sep. 28, 2001, the entire contents of which are incorporated herein by reference.

BACKGROUND OF THE INVENTION

1. Field of the Invention

The present invention relates to a semiconductor device and a method of manufacturing a semiconductor device, and in particular, to a technique to stack substrates each having an integrated circuit chip.

2. Description of the Related Art

In recent years, stacked semiconductor devices have been proposed in each of which a plurality of integrated circuit chips (LSI chips) are stacked on one another.

FIG. 10 is a diagram showing a method of producing such a stacked semiconductor device. This method connects substrates 10 together on each of which an LSI chip is mounted (such substrates will hereinafter be referred to as chip mounted substrates), via a substrate 20 on which no chips are mounted (such a substrate will hereinafter be referred to as a chip-less substrate). Usually, more chip mounted substrates 10 and chip-less substrates 20 are stacked. For simplification of description, the figure shows only a part in which the two chip mounted substrates 10 and the one chip-less substrate 20 are stacked on one another.

An LSI chip 12 is mounted on a substrate main body 11 of the chip mounted substrate 10. External terminals (not shown) of the LSI chip 12 are connected to respective interconnects (not shown) provided on the substrate main body 11 via anisotropic conductive materials 14. The interconnects are connected to respective lands 16 provided on the substrate main body 11. The lands 16 are connected to respective through plugs (via plugs) 17 penetrating the substrate main body 11.

A plurality of the chip mounted substrates 10 are mounted on the chip-less substrate 20. Openings (device holes 22) are each formed in the chip-less substrate 20 in association with an area of the chip mounted substrate 10 in which the LSI chip 12 is mounted. Furthermore, a substrate main body 21 of the chip-less substrate 20 is formed with lands 23 and through plugs (via plugs) 24 penetrating the substrate main body 21.

When the chip mounted substrates 10 and the chip-less substrate 20 are stacked on one another, the chip mounted substrates 10 and the chip-less substrate 20 are bonded together using a resin-based adhesive 29 applied to front and back surfaces of the chip-less substrate 20.

In this manner, in the above described conventional semiconductor device, the chip mounted substrates 10 and the chip-less substrate 20 are bonded together using the resin-based adhesive 29. However, the resin-based adhesive 29 does not have a high adhesive strength. Accordingly, a bonded area must be enlarged in order to obtain a sufficient adhesive strength. Disadvantageously, this unavoidably increases the area of each chip mounted substrate 10, preventing an increase in the number of chip mounted substrates 10 that can be mounted on the one chip-less substrate 20.

Furthermore, if the resin-based adhesive 29 is applied after the formation of the device hole 22, the device hole 22 may be filled with the adhesive 29 and other problems may occur. Thus, the adhesive 29 is applied to both surfaces of the substrate main body 21 of the chip-less substrate 20 before the formation of the device holes 22. However, since the adhesive 29 is applied to both surfaces of the substrate main body 21, production efficiency may disadvantageously be degraded. Furthermore, when the device holes 22 are formed, the adhesive 29 may form flashes or the like. This may degrade reliability.

As described above, in the prior art, the chip mounted substrates and the chip-less substrate are bonded together using the resin-based adhesive, which does not have a strong adhesive force. Thus disadvantageously, it is difficult to reduce the size of each chip mounted substrate, and the number of chip mounted substrates that can be mounted on the chip-less substrate cannot be increased. Furthermore, in the prior art, since the adhesive is applied to both surfaces of the chip-less substrate before the formation of the device holes, the production efficiency and reliability may disadvantageously be degraded.

BRIEF SUMMARY OF THE INVENTION

A first aspect of the present invention is a method of manufacturing a semiconductor device, the method comprising: preparing a first substrate including an integrated circuit chip, first connection terminals electrically connected to terminals of the integrated circuit chip, and a first connection portion spaced from the first connection terminals; preparing a second substrate including second connection terminals to be electrically connected to the first connection terminals and a second connection portion spaced from the second connection terminals; providing a metal material portion for bonding on the first connection portion or the second connection portion; and stacking the first substrate and the second substrate by connecting the first connection portion and the second connection portion together via the metal material portion by thermo compression bonding.

A second aspect of the present invention is a semiconductor device comprising: a first substrate including an integrated circuit chip, first connection terminals electrically connected to terminals of the integrated circuit chip, and a first connection portion spaced from the first connection terminals; a second substrate stacked on the first substrate and including second connection terminals and a second connection portion spaced from the second connection terminals; and a metal material portion provided between the first connection portion and the second connection portion and bonding the first connection portion to the second connection portion.

A third aspect of the present invention is a method of manufacturing a semiconductor device, the method comprising: preparing a plurality of unit substrates each comprising a first substrate and a second substrate stacked, the first substrate including an integrated circuit chip and first connection terminals electrically connected to terminals of the integrated circuit chip, the second substrate including second connection terminals electrically connected to the first connection terminals; and stacking the unit substrates by bonding the unit substrates adjacent to each other in a stacking direction using an adhesive sheet.

A fourth aspect of the present invention is a semiconductor device comprising: a plurality of unit substrates each comprising a first substrate and a second substrate stacked, the first substrate including an integrated circuit chip and first connection terminals electrically connected to terminals of the integrated circuit chip, the second substrate including second connection terminals electrically connected to the first connection terminals; and an adhesive sheet interposed between the unit substrates adjacent to each other in a stacking direction and bonding the unit substrates together.

DETAILED DESCRIPTION OF THE INVENTION

With reference to the drawings, description will be given below of a method of manufacturing a stacked semiconductor device according to an embodiment of the present invention.

Figure 1A:
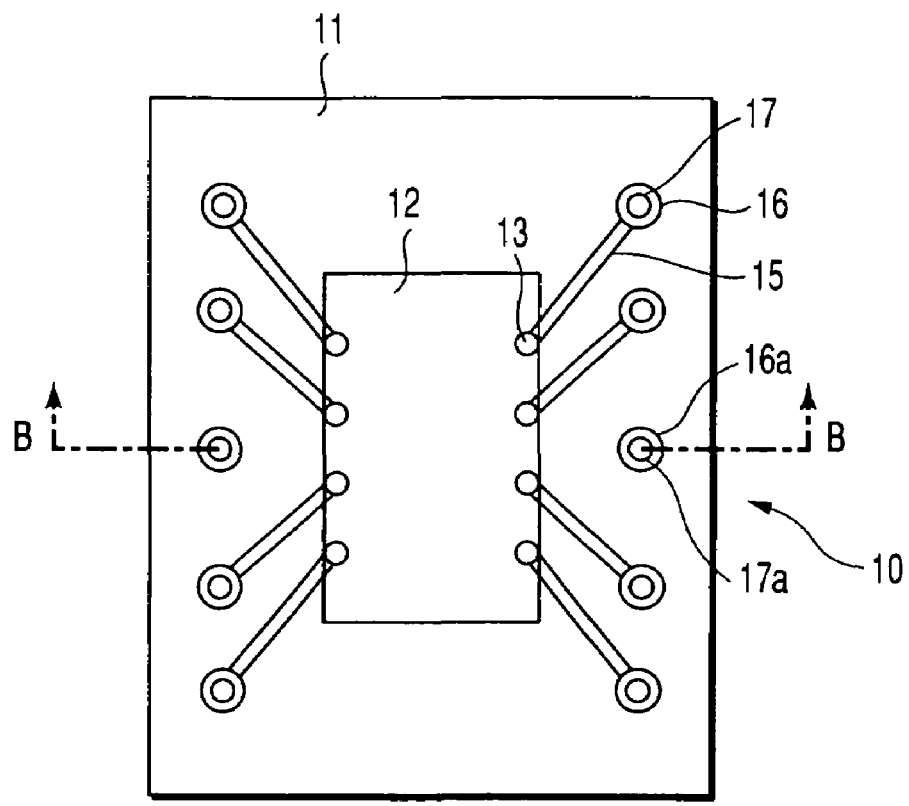
FIGS. 1A and 1B are diagrams showing a part of a process of manufacturing a semiconductor device according to an embodiment of the present invention.
Figure 1B:
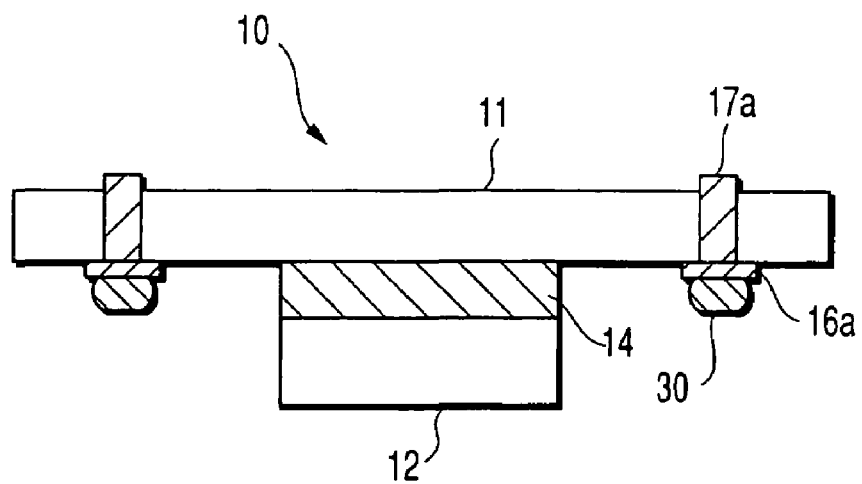

FIG. 1A is a diagram schematically showing the planar configuration of a chip mounted substrate 10. FIG. 1B is a diagram schematically showing the sectional configuration of the chip mounted substrate 10 along line B—B in FIG. 1A.

An LSI chip 12 is mounted on a substrate main body 11 of the chip mounted substrate 10 via an anisotropic conductive material 14. External terminals 13 of the LSI chip 12 are electrically connected to respective interconnects 15 provided on the substrate main body 11 via the anisotropic conductive material 14. The interconnects 15 are connected to respective lands 16 provided on the substrate main body 11. The lands 16 are electrically connected to respective through plugs (via plugs) 17 penetrating the substrate main body 11. The interconnects 15, the lands 16, and the through plugs 17 are formed of a metal material such as copper which has a low resistance. The lands 16 (through plugs 17) have a pitch of, for example, 0.45 mm and a diameter of, for example, 0.35 mm.

Pairs of a dummy land 16a and a dummy through plug 17a are each formed in a predetermined part between connection terminals each composed of the land 16 and the through plug 17, as a dummy terminal spaced from the lands 16 and through plugs 17; that is, the dummy terminal is not electrically connected to any external terminals 13 of the LSI chip 12. The dummy lands 16a and dummy through plugs 17a, and the lands 16 and through plugs 17 proper, electrically connected to the external terminal 13 of the LSI chip 12 can be simultaneously formed of the same material.

A metal material portion 30 is formed on each of the dummy lands 16a; the metal material portion is formed of a metal material such as solder, tin, or an Sn—Bi alloy which has a low melting point. The metal material portions 30 are used to bond the chip mounted substrate 10 to a chip-less substrate 20, described later. The chip mounted substrate 10 and the chip-less substrate 20 are bonded together by thermo compression bonding so that the metal material portions 30 are molten. Each of the metal material portions 30 has a diameter of, for example, 0.2 mm and a thickness of, for example, 0.75 mm or less (for example, 0.075 mm). Normally, the metal material portion is similarly formed on each of the lands 16 proper. However, in the process described below, the metal material portions on the lands 16 are not thermally molten.

The metal material portions 30 may be formed after or before the LSI chip 12 is mounted. The distance from each dummy land 16a to the adjacent land 16 is preferably longer than the distance between the two lands 16 so that upon thermo compression bonding, the molten metal material portion 30 will not electrically short-circuit the dummy land 16a and the adjacent land 16.

Figure 2A:
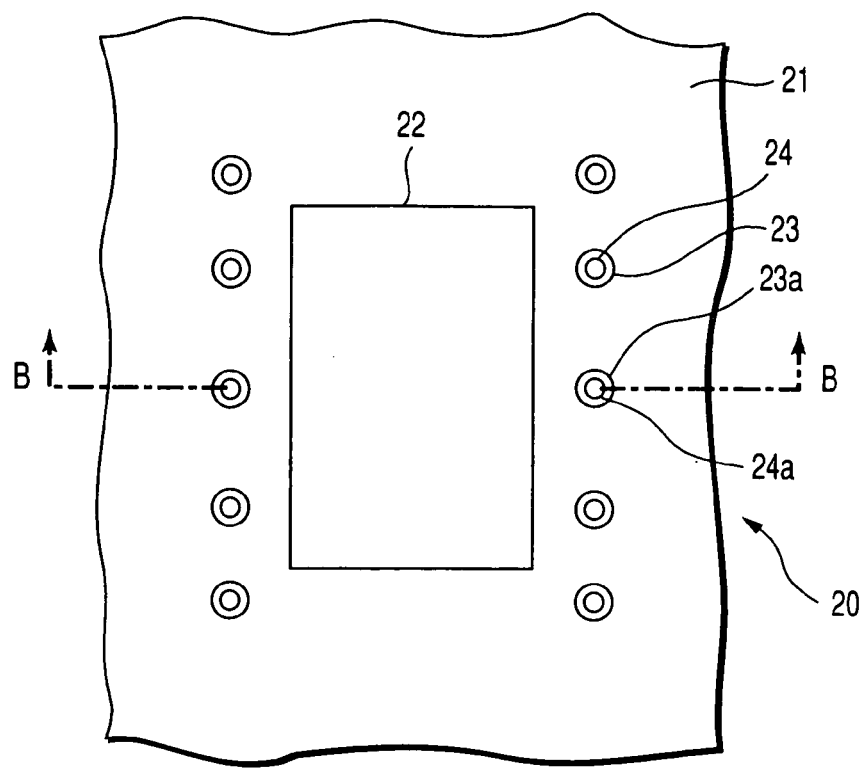
FIGS. 2A and 2B are diagrams showing a part of the process of manufacturing a semiconductor device according to the embodiment of the present invention.
Figure 2B:
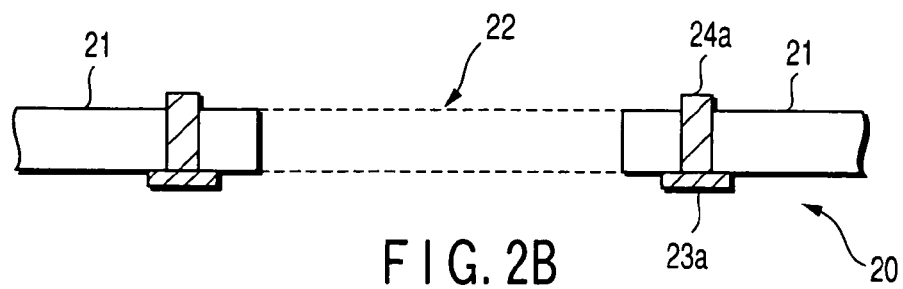

FIG. 2A is a diagram schematically showing the planar configuration of the chip-less substrate 20. FIG. 2B is a diagram schematically showing the sectional configuration of the chip-less substrate 20 along line B—B in FIG. 2A.

A plurality of the chip mounted substrates 10, shown in FIG. 1, are mounted on the chip-less substrate 20. Openings (device holes 22) are each formed in the chip-less substrate 20 in association with an area of the chip mounted substrate 10 in which the LSI chip 12 is mounted. Furthermore, a substrate main body 21 of the chip-less substrate 20 is formed with lands 23. The lands 23 are electrically connected to respective through plugs (via plugs 24) penetrating the substrate main body 21. The lands 23 and the through plugs 24 are formed of a metal material such as copper which has a low resistance. The lands 23 and the through plugs 24 are arranged at positions corresponding to the lands 16 and through plugs 17, respectively, provided on the chip mounted substrate 10.

Pairs of a dummy land 23a and a dummy through plug 24a are each formed in a predetermined part between connection terminals each composed of the land 23 and the through plug 23, as a dummy terminal spaced from the lands 23 and through plugs 24. The dummy lands 23a and dummy through plugs 24a and the lands 23 and through plugs 24 proper can be simultaneously formed of the same material. The dummy lands 23a and the dummy through plugs 24a are arranged at positions corresponding to the dummy lands 16a and dummy through plugs 17a, respectively, provided in the chip mounted substrate 10.

Figure 3:
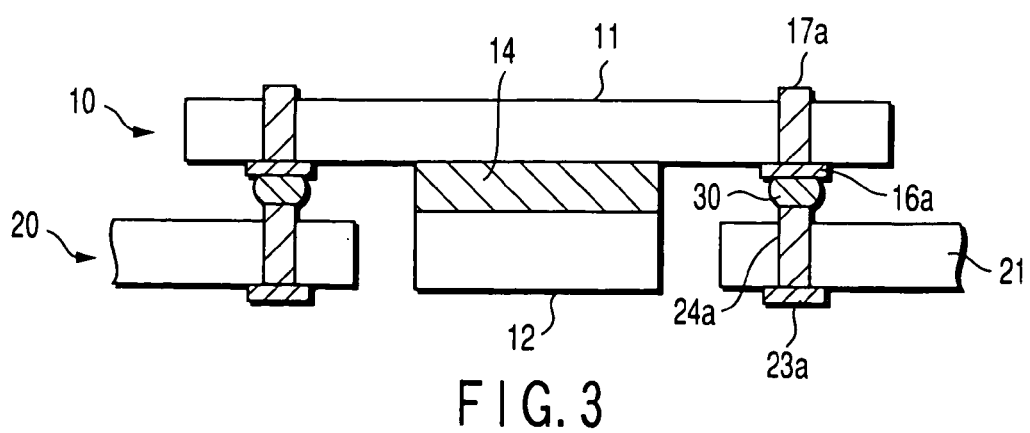
FIG. 3 is a diagram showing a part of the process of manufacturing a semiconductor device according to the embodiment of the present invention.

Then, as shown in FIG. 3, the chip mounted substrate 10 and chip-less substrate 20, provided as described above, are stacked on each other. The substrates are stacked on each other by aligning the substrates with each other and then using a thermo compression bonding jig that can be heated to selectively heat only the metal material portions 30 in the respective areas in which the dummy land and the dummy through plug are present, while contacting the substrates with each other and pressing them against each other. Conditions for the thermo compression bonding include, for example, a temperature of 95° C. and a pressure of 0.5 MPa. As a result, the metal material portion 30 is molten, and after the heating, the dummy land 16a and the dummy through plug 24a are firmly bonded together by the metal material portion 30. In this case, by using ultrasonic wave together with the heating as required, it is possible to reduce the time required for the connection (for example, to about two-thirds). In each of the parts in which the land and through plug proper are present, which are different from the dummy land and dummy through plug, respectively, the metal material portion is not thermally molten. Thus, the land and the through plug are electrically connected together via the metal material portion maintained in a solid state.

In the present example, the metal material portion 30 is formed on each of the dummy lands 16a of the chip mounted substrate 10. However, the metal material portion 30 may be formed on each of the dummy through plugs 24a of the chip-less substrate 20. Furthermore, each dummy land 16a and the corresponding dummy through plug 17a of the chip mounted substrate 10 may be reversely arranged in a vertical direction, whereas each dummy land 23a and the corresponding dummy through plug 24a of the chip-less substrate 20 may be reversely arranged in the vertical direction. Then, the dummy through plug 17a and the dummy land 23a may be connected together via the metal material portion 30. In this case, the dummy lands, dummy through plugs, and metal material portion are connected together in the order of 16a, 17a, 30, 23a, and 24a from the top to bottom of FIG. 3. Also in this case, the metal material portion 30 may be formed on the dummy through plug 17a of the chip mounted substrate 10 or on the dummy land 23a of the chip-less substrate 20. Alternatively, the metal material portion 30 may be formed on both dummy land and dummy through plug.

Figure 7:
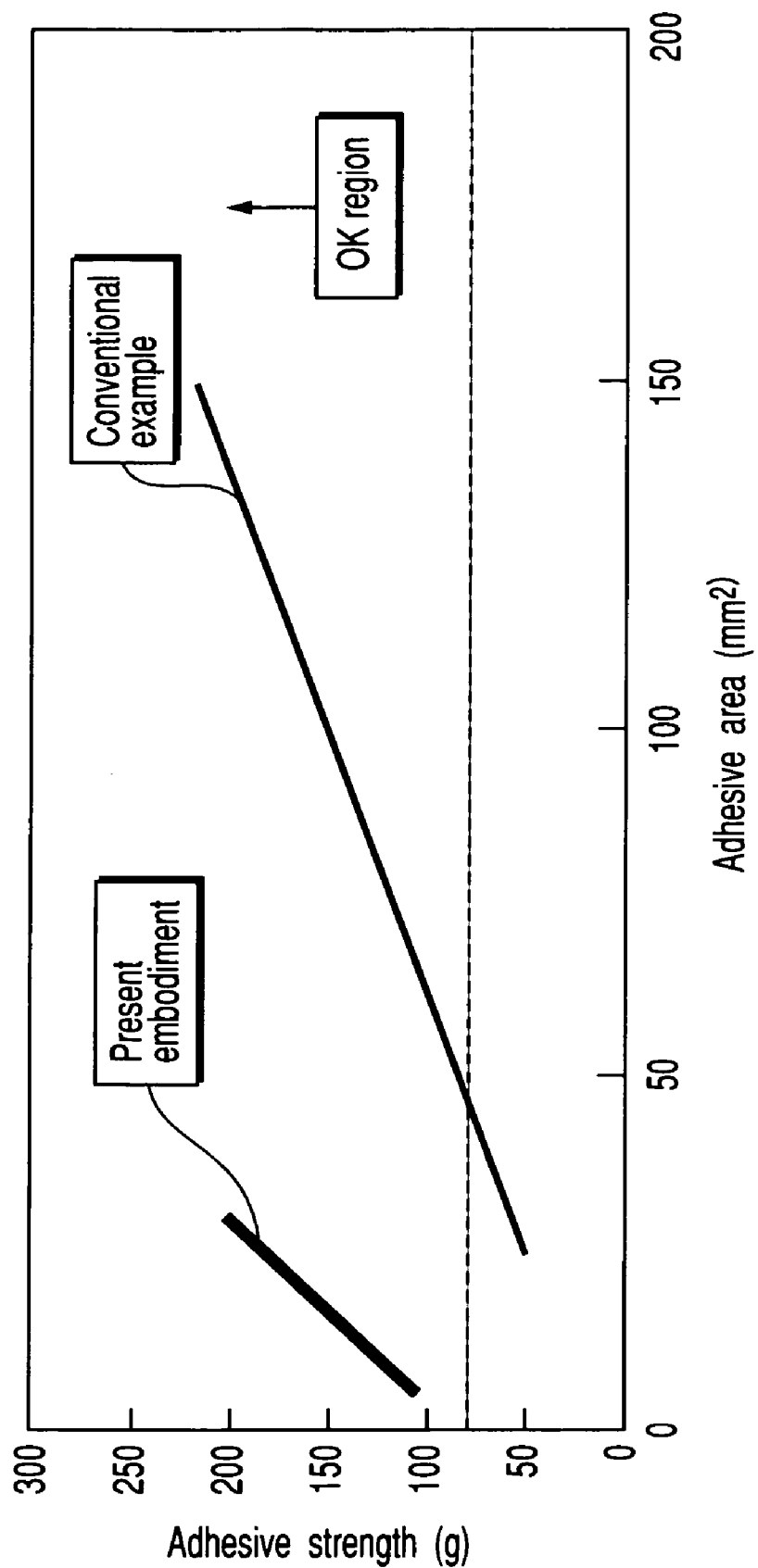
FIG. 7 is a graph showing, in comparison with the prior art, an adhesive strength obtained on the basis of a method according to the embodiment of the present invention.
Figure 10:
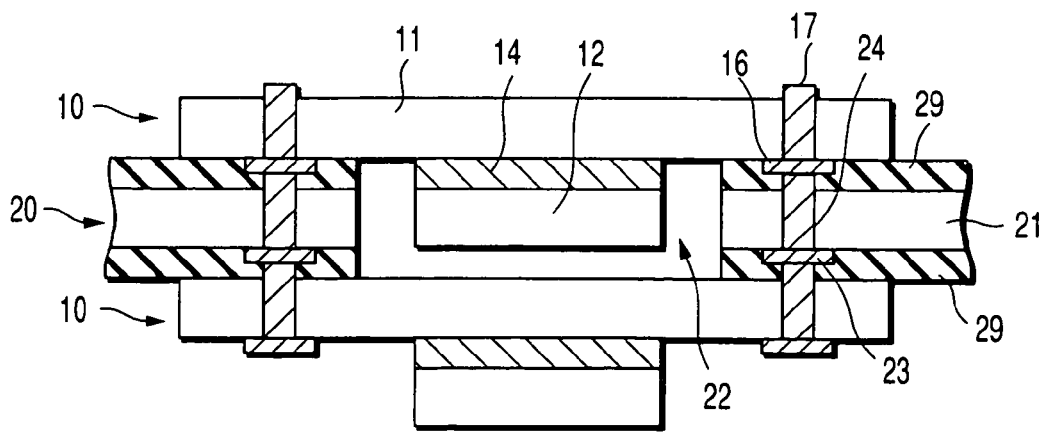
FIG. 10 is a diagram showing a semiconductor device according to the prior art.

FIG. 7 is a graph showing, in comparison with the prior art (the method shown in FIG. 10), an adhesive strength obtained on the basis of the method according to the embodiment of the present invention. The axis of abscissa indicates the area of a bonded part. The axis of ordinate indicates an adhesive strength. As is apparent from this figure, the present embodiment makes it possible to obtain a required adhesive strength (an adhesive strength of about 80 g or more, shown in the OK region) even with a very small bonded area compared to the prior art.

In this manner, in the present embodiment, each dummy land and the corresponding dummy through plug are connected together by thermo compression bonding using the metal material portion having a high adhesive strength. Consequently, a sufficient adhesive strength can be obtained even with a reduced bonded area. This enables a reduction in the area of each chip mounted substrate. It is thus possible to increase the number of chip mounted substrates that can be mounted on one chip-less substrate. Furthermore, the dummy land and dummy through plug can be formed between the areas in each of which the lands and through plugs proper are arranged, simultaneously with the formation of the lands and through plugs proper, using the same material as that of the lands and through plugs proper. Accordingly, the dummy land and the dummy through plug can be efficiently formed in terms of the positions and manufacturing process.

Figure 4:
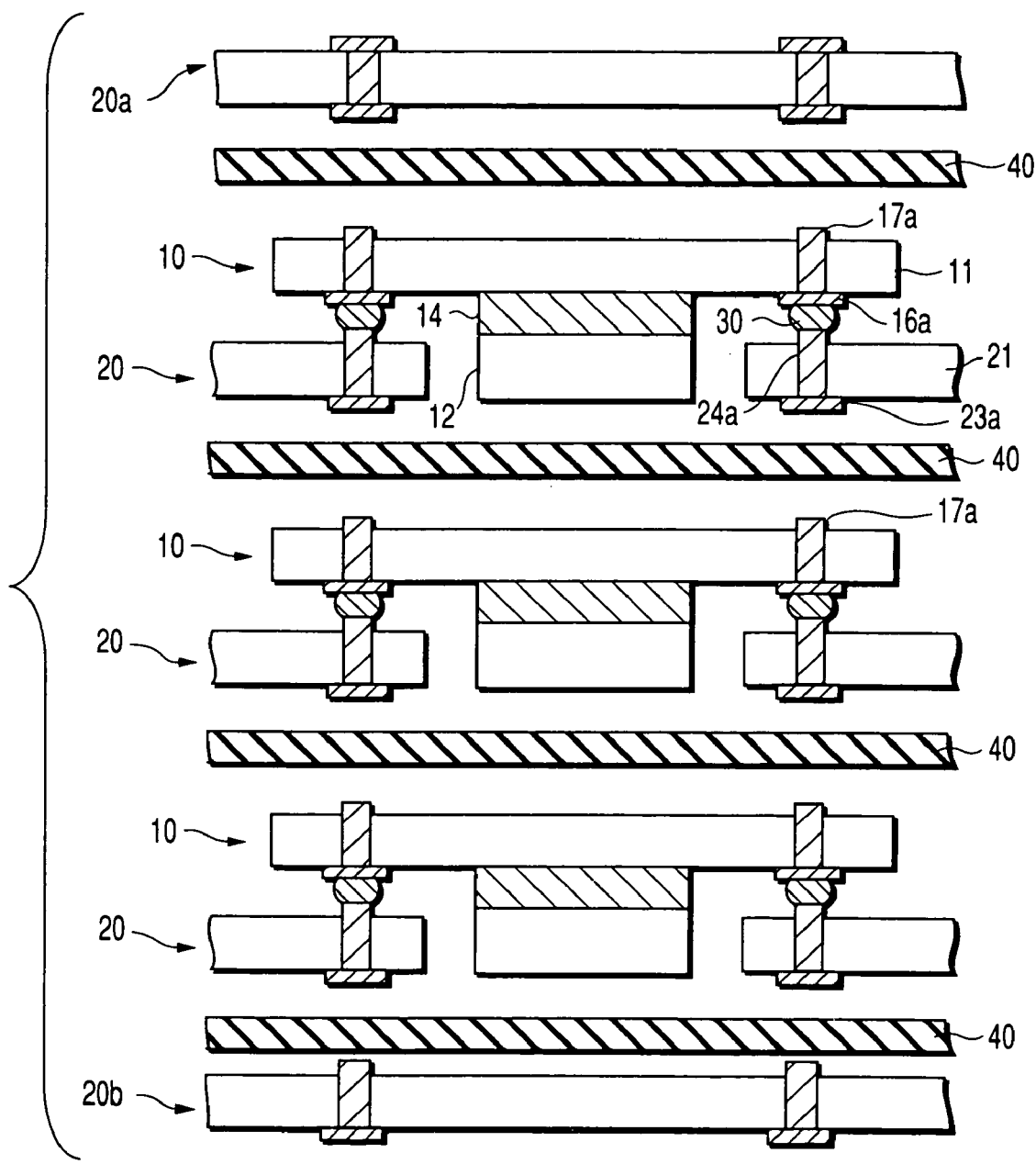
FIG. 4 is a diagram showing a part of the process of manufacturing a semiconductor device according to the embodiment of the present invention.

Then, as shown in FIG. 4, in order to stack a plurality of the unit substrates on one another, each unit substrate comprising the chip mounted substrate 10 and the chip-less substrate 20 bonded together, an adhesive sheet (a sheet-like adhesive) 40 is located between each pair of unit substrates. A chip-less substrates 20a and 20b in which no device holes are formed are arranged in the uppermost and lowermost layers, respectively. The adhesive sheets 40 may be resin-based adhesives (for example, epoxy resin-based adhesives). The through plugs and the lands may be formed in only one of the chip-less substrates 20a and 20b. Alternatively, a plurality of the chip-less substrates 20a or 20b may be stacked on one another.

After the unit substrates have been arranged as shown in FIG. 4, they are pressurized in a stacking direction so as to be bonded together using the adhesive sheets 40. The adhesive sheets 40 are soft, so that each dummy through plug 17a is connected to the corresponding dummy land 23a so as to penetrate the adhesive sheet 40. Each land proper and the corresponding through plug proper, which are different from the dummy land and the dummy through plug, respectively, are similarly connected together so as to penetrate the adhesive sheet 40.

In this manner, in the present embodiment, the unit substrates are bonded together via the adhesive sheets. This eliminates the need to apply an adhesive to both surfaces of each chip-less substrate before the formation of a device hole as in the case of the prior art. It is thus possible to improve the production efficiency and reliability of the stacked semiconductor device.

Figure 5:
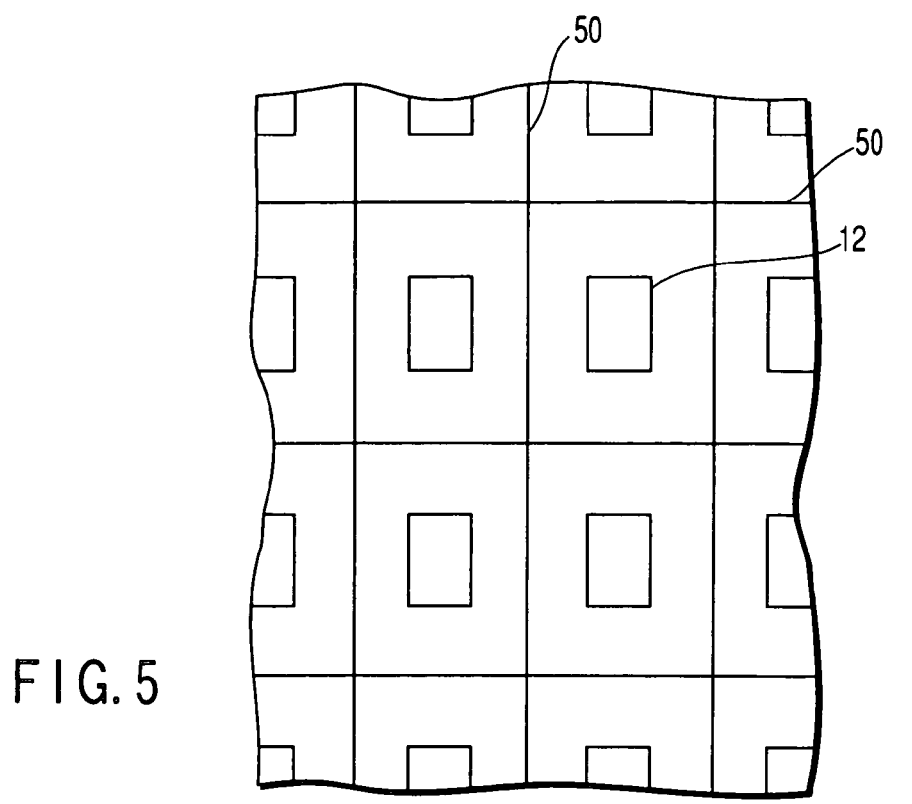
FIG. 5 is a diagram showing a part of the process of manufacturing a semiconductor device according to the embodiment of the present invention.
Figure 6:
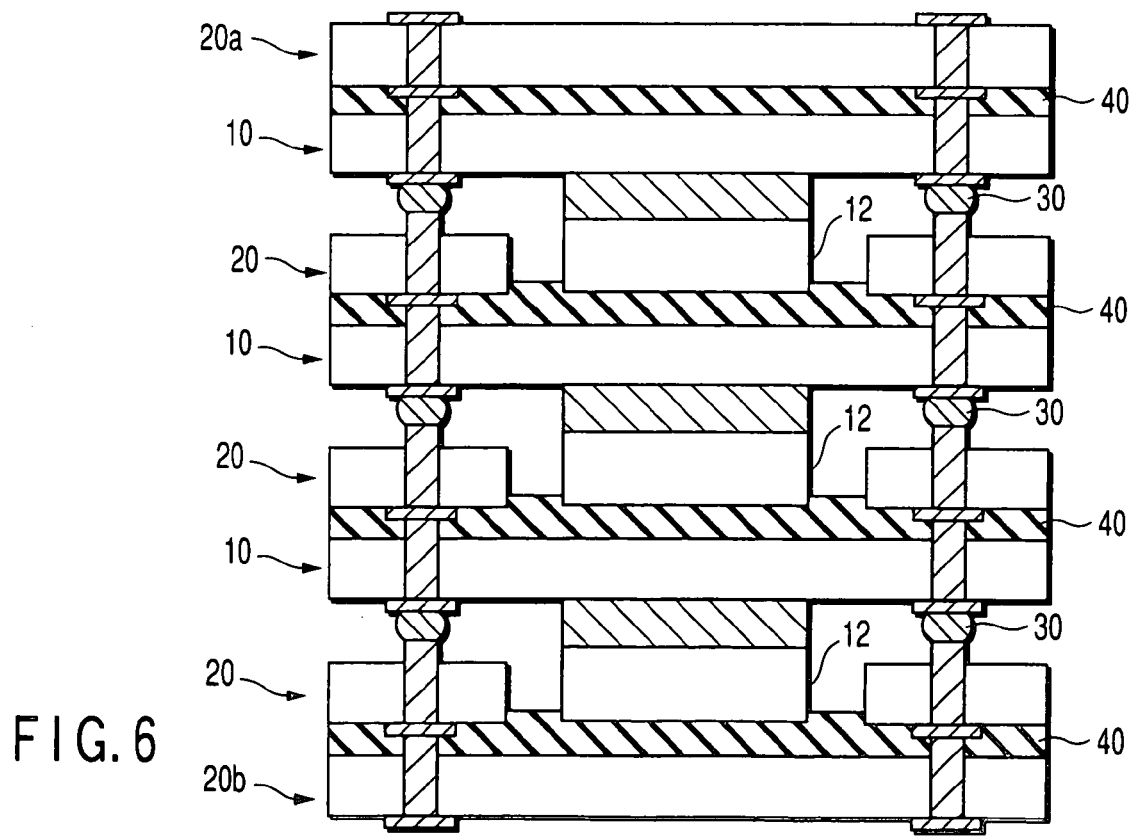
FIG. 6 is a diagram showing a part of the process of manufacturing a semiconductor device according to the embodiment of the present invention.

After the plurality of unit substrates have been stacked on one another, the stacked substrate is cut along break lines 50 to divide the stacked substrate into areas in each of which a chip 12 is mounted, as shown in FIG. 5. This results in stacked semiconductor device having the plurality of chip mounted substrates 10 and chip-less substrates 20 stacked on one another as shown in FIG. 6.

In the above described embodiment, the metal material portion is provided in each part in which the dummy land and the dummy through plug are formed. However, the metal material portion may be provided in other parts as shown in the following variations.

Figure 8A:
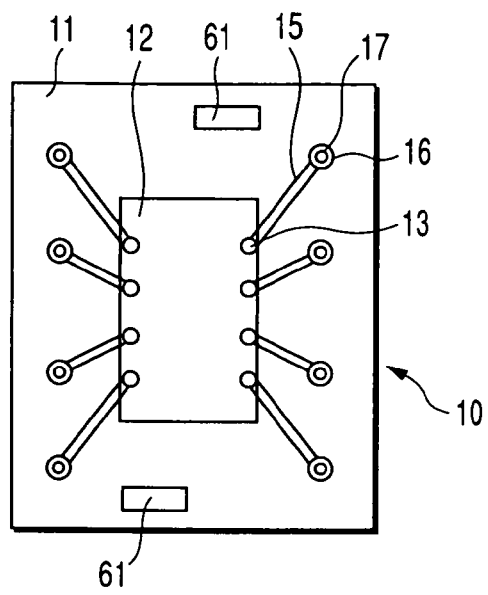
FIGS. 8A to 8C are diagrams showing a first variation of the embodiment of the present invention.
Figure 8B:
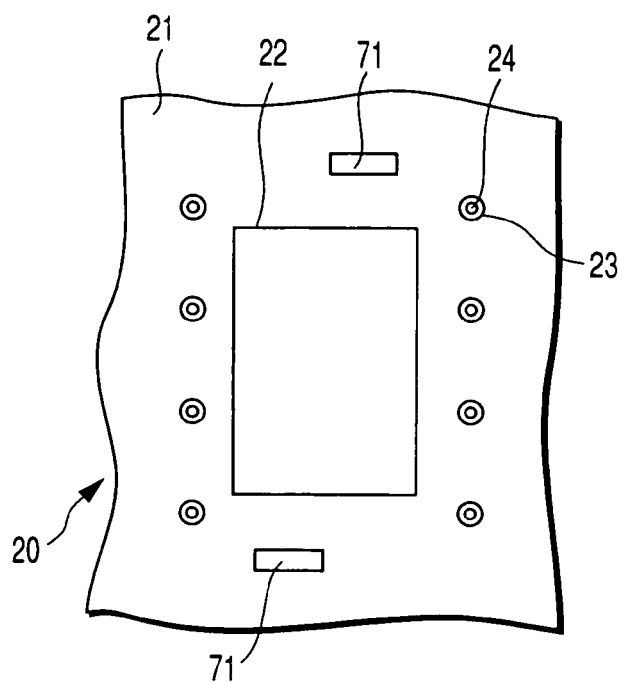
Figure 8C:
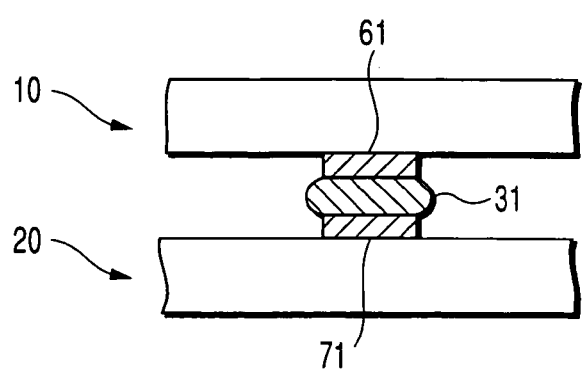

FIGS. 8A to 8C show a first variation. FIG. 8A is a diagram showing the planar configuration of the chip mounted substrate 10. FIG. 8B is a diagram showing the planar configuration of the chip-less substrate 20. FIG. 8C is a diagram showing the sectional configuration of the vicinity of a bonded area of the bonded substrates. The basic configuration, bonding method, and the like of this variation are similar to those of the above described embodiment. Their description is thus omitted.

In the present variation, dummy pads 61 are provided on the chip mounted substrate 10, while dummy pads 71 are provided on the chip-less substrate 20. The chip mounted substrate 10 and the chip-less substrate 20 are bonded together using metal material portions 31 each formed on at least one of the dummy pad 61 and the dummy pad 71. The metal material portions 31 are formed of a metal material such as solder, tin, or an Sn—Bi alloy which has a low melting point. The dummy pads 61 and 71 may be formed of a metal material such as copper.

The present variation produces basic effects similar to those of the above described embodiment. Moreover, the dummy pads can be arranged in arbitrary areas in arbitrary forms. This makes it possible to increase the degree of freedom of design.

Figure 9A:
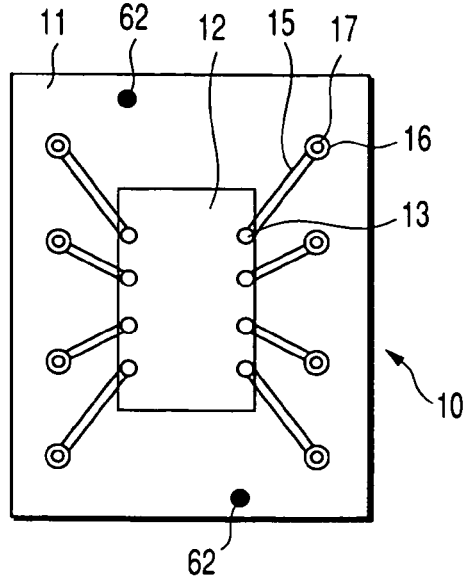
FIGS. 9A to 9C are diagrams showing a second variation of the embodiment of the present invention.
Figure 9B:
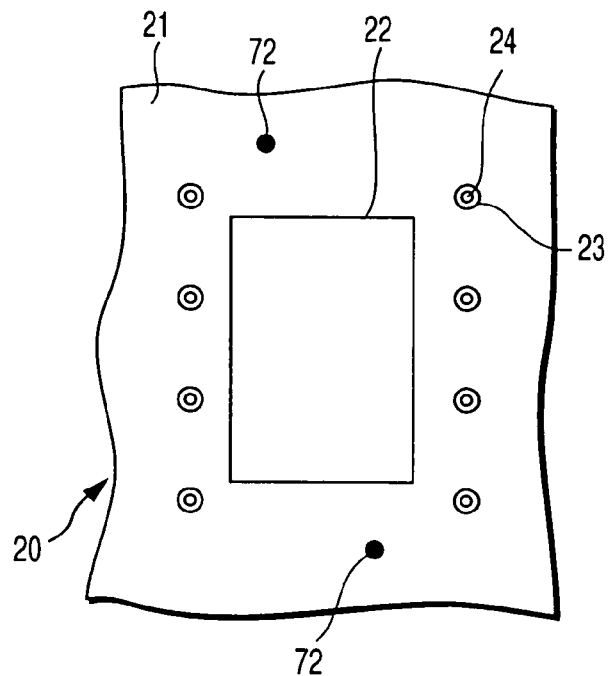
Figure 9C:
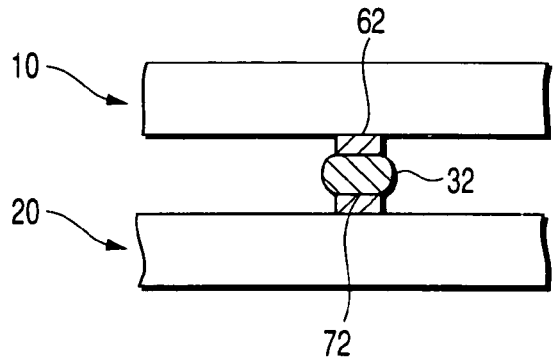

FIGS. 9A to 9C show a second variation. FIG. 9A is a diagram showing the planar configuration of the chip mounted substrate 10. FIG. 9B is a diagram showing the planar configuration of the chip-less substrate 20. FIG. 9C is a diagram showing the sectional configuration of the vicinity of a bonded area of the bonded substrates. The basic configuration, bonding method, and the like of this variation are similar to those of the above described embodiment. Their description is thus omitted.

The present variation utilizes alignment marks 62 and 72 (formed of a metal material) for aligning the chip mounted substrate 10 and the chip-less substrate 20 with each other when they are stacked on each other. Each metal material portion 32 is formed on at least one of the alignment mark 62 and the alignment mark 72. The chip mounted substrate 10 and the chip-less substrate 20 are bonded together using the metal material portions 32. The metal material portions 32 are formed of a metal material such as solder, tin, or an Sn—Bi alloy which has a low melting point.

The present variation produces basic effects similar to those of the above described embodiment. Moreover, the use of the alignment marks eliminates the need to provide dummy terminals or pads. This enables a further reduction in the size of each substrate and in the time required for the process.

As described above, according to the embodiments of the present invention, the chip mounted substrate and the chip-less substrate are bonded together using the metal material portions having a strong adhesive force. Consequently, a sufficient adhesive strength can be obtained even with a reduced bonded area. This enables a reduction in the size of each chip mounted substrate. It is thus possible to sharply increase the number of chip mounted substrates that can be mounted on the chip-less substrate.

Furthermore, according to the embodiments of the present invention, the unit substrates each formed of the chip mounted substrate and the chip-less substrate are bonded together using the adhesive sheets. This improves the production efficiency and reliability of the stacked substrates compared to the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first substrate including an integrated circuit chip; first connection terminals, having a first spacing therebetween, electrically connected to terminals of the integrated circuit chip; and a first connection portion spaced from the first connection terminals at a second spacing greater than the first spacing and not electrically connected to any terminal of the integrated circuit chip;
   a second substrate stacked on the first substrate and including second connection terminals having the first spacing therebetween and a second connection portion spaced from the second connection terminals at the second spacing;
   a metal material portion provided between the first connection portion and the second connection portion, bonding the first connection portion to the second connection portion and not electrically connected to any terminal of the integrated circuit chip, the first connection portion being bonded to the second connection portion by thermo compression bonding; and
   the first connection terminals being electrically connected to the second connection terminals, the electrical connection between the first connection terminals and the second connection terminals not being provided by thermal compression bonding.

2. The semiconductor device according to claim 1, wherein a plurality of unit substrates are stacked, each of the unit substrates being formed of the first and second substrates stacked.

3. The semiconductor device according to claim 2, further comprising an adhesive sheet interposed between the unit substrates adjacent to each other in a stacking direction and bonding the unit substrates together.

4. The semiconductor device according to claim 1, wherein the first connection portion is a first dummy terminal provided between the first connection terminals adjacent to each other in a plane direction, and the second connection portion is a second dummy terminal provided between the second connection terminals adjacent to each other in the plane direction.

5. The semiconductor device according to claim 1, wherein the first connection portion is a first dummy pad provided on the first substrate, and the second connection portion is a second dummy pad provided on the second substrate.

6. The semiconductor device according to claim 1, wherein the first connection portion is a first alignment mark provided on the first substrate and used to align the first substrate with the second substrate, and the second connection portion is a second alignment mark provided on the second substrate and used to align the first substrate with the second substrate.

7. The semiconductor device according to claim 1, wherein the metal material portion is formed of solder, tin, or an Sn—Bi alloy.

8. The semiconductor device according to claim 3, wherein the adhesive sheet is formed of resin.

* * * * *